(12) United States Patent
Spall et al.

(10) Patent No.: US 7,471,554 B2
(45) Date of Patent: Dec. 30, 2008

(54) PHASE CHANGE MEMORY LATCH

(75) Inventors: Edward J. Spall, Manassas, VA (US); Tyler Lowrey, West Augusta, VA (US)

(73) Assignee: Ovonyx, Inc., Rochester Hills, MI (US)

( * ) Notice: Subject to any disclaimer, the term of this patent is extended or adjusted under 35 U.S.C. 154(b) by 286 days.

(21) Appl. No.: 11/341,983

(22) Filed: Jan. 27, 2006

(65) Prior Publication Data

US 2007/0177432 A1   Aug. 2, 2007

(51) Int. Cl.
 *G11C 11/00* (2006.01)
(52) U.S. Cl. ............... 365/163; 365/154; 365/189.16
(58) Field of Classification Search ............. 365/148, 365/154, 156, 161, 163, 185.07, 185.08, 365/189.16
See application file for complete search history.

(56) References Cited

U.S. PATENT DOCUMENTS

| | | | | |
|---|---|---|---|---|
| 5,406,528 | A * | 4/1995 | Kim | 365/230.08 |
| 6,847,543 | B2 * | 1/2005 | Toyoda et al. | 365/154 |
| 6,862,226 | B2 * | 3/2005 | Toyoda et al. | 365/189.07 |
| 6,914,255 | B2 * | 7/2005 | Lowrey | 257/5 |
| 6,944,050 | B2 * | 9/2005 | Kang et al. | 365/158 |
| 7,012,834 | B2 * | 3/2006 | Cho et al. | 365/163 |
| 7,038,938 | B2 * | 5/2006 | Kang | 365/154 |
| 7,206,217 | B2 * | 4/2007 | Ohtsuka et al. | 365/154 |
| 2006/0291272 | A1 * | 12/2006 | Lowrey et al. | 365/154 |

* cited by examiner

*Primary Examiner*—VanThu Nguyen
*Assistant Examiner*—Alexander Sofocleous
(74) *Attorney, Agent, or Firm*—Trop, Pruner & Hu, P.C.

(57) ABSTRACT

A non-volatile memory latch may be formed with a phase change memory layer. Such a latch may be faster and more easily integrated into main stream semiconductor processes than conventional latches that use non-volatile memory elements such as flash memory.

17 Claims, 4 Drawing Sheets

PHASE CHANGE MEMORY LATCH

BACKGROUND

This invention relates generally to latches and, particularly, to latches that use non-volatile memory elements.

A latch is a simple storage circuit which stores a binary state. Thus, a latch may be used to configure an integrated circuit including the latch. In one application, the latch may be utilized to store a state that enables the integrated circuit to be customized for a particular application.

A non-volatile memory is one which stores content even when the power to the circuit is removed. Generally, the non-volatile memory element may be reprogrammed to different states after having been first programmed.

While conventional non-volatile latches are effective, it would be desirable to provide a non-volatile latch which is faster and more easily integrated into mainstream semiconductor processes than some existing nonvolatile latches.

DETAILED DESCRIPTION

Figure 1:
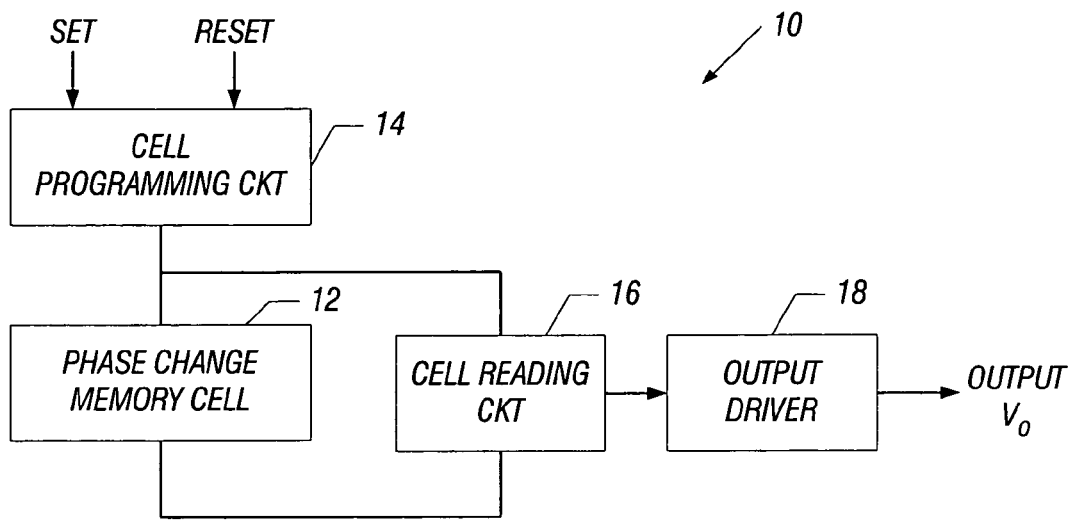
FIG. 1 is a schematic depiction of one embodiment of the present invention.

Referring to FIG. 1, a latch circuit 10 includes a phase change memory cell 12. The phase change memory cell 12 may be a chalcogenide containing memory. In one embodiment, it has two programmable states, one of the states having a higher resistance than the other. In one embodiment, the phase change memory cell may be an ovonic unified memory or OUM.

A programming circuit 14 receives set and reset signals and uses those signals to program the memory cell 12 to a higher or lower resistance state. A reading circuit 16 reads the programmed state of the phase change memory cell 12. The circuit 16 provides the state to an output driver 18. The output driver 18 issues an output voltage $V_o$ in one embodiment.

Figure 2:
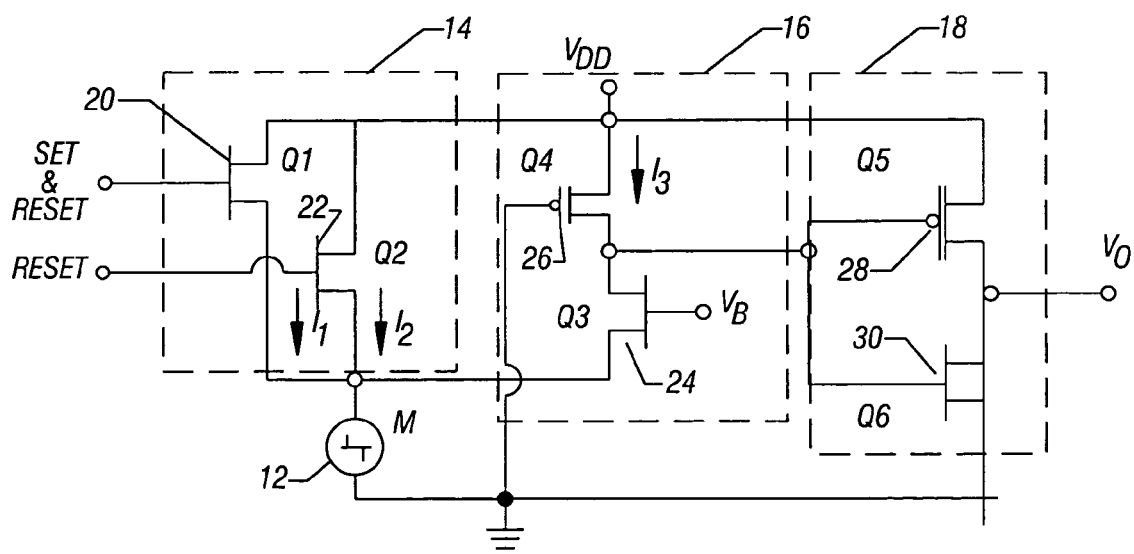
FIG. 2 is a schematic drawing of one embodiment of the present invention.

Referring to FIG. 2, a specific implementation of the latch 10 shown in FIG. 1 is illustrated. The programming circuit 14 includes a pair of transistors 20 and 22, also indicated as Q1 and Q2. The transistor 22 conducts a current I2 when the transistor 22 is on and the transistor 20 conducts a current I1 when it is on. In one embodiment, the transistors 20, 22 may be MOS transistors. In other embodiments the transistors 20, 22 may be bipolar transistors.

Programming Circuit

In one embodiment the programming circuit 14 consists of transistors 20 and 22. These transistors are designed to provide I1 and I2 respectively, where I1 is the current required to set the device into the low resistance or crystalline state, and I2 is the relatively higher current required to reset the device into the high resistance or amorphous state. Initially both transistor gates are held at ground. In order to program OUM device 12 to the low resistance state the gate of transistor 20 is driven to Vdd volts and then returned to ground creating a pulse current, I1, to flow through device 12 which sets the device in the low resistance state. To reset the device 12 the gate of transistor 22 is driven to zero volts and returned to Vdd causing a larger pulse current flow, I2, to flow through device 12 which resets the device. The widths of the set and reset pulses may be on the order of 50 nanoseconds and 30 nanoseconds respectively.

In another embodiment instead of having separate set and reset current transistors the reset current may be formed by turning on both transistors 20 and 22 simultaneously thus saving chip area with respect to the embodiment described above. In this embodiment, reset current would be I1+I2.

In another embodiment the transistors 20 and 22 may be bipolar transistors.

Read Circuit

The cell reading circuit 16 receives a supply voltage $V_{DD}$. That supply voltage is applied to the transistor 24, also labeled Q3. The transistor 24 provides a maximum current of $I_3$. The transistor 24 is coupled to a transistor 26, also labeled Q4. The transistor 26 is coupled to the transistors 20 and 22. The gate of the transistor 26 receives a signal $V_b$. The gate of the transistor 24 or Q3 is grounded.

Output Driver

The output driver 18 may be an inverter including transistors 28 and 30, also labeled Q5 and Q6. The output of the inverter, made up of the transistors 28 and 30, is the output voltage $V_O$ which is either 0 volts or Vdd corresponding to a logic zero or one respectively, depending on the state of the cell 12.

In one embodiment, the transistors Q1, Q2, Q4 and Q6 may be NMOS transistors, while the transistors Q3 and Q5 may be PMOS transistors. However, an embodiment with bipolar transistors may be used in some cases.

Normal Operation

In normal operation, the memory cell 12 is set to either a lower resistance state or a higher resistance state by a write operation. In one embodiment, the lower resistance state may be one to ten kiloOhms and, and the higher resistance state may be 100 to 1000 kiloOhms.

The state of the memory device 12 may be continuously monitored at all times other than during setting and resetting by the combination of transistors 24 and 26. The transistor 24 is always on and is capable of producing a maximum current I3 which is less than $I_{safe}$. $I_{safe}$ is the highest value of the read current that does not result in a disturbance of the set state of the memory element 12. The size of transistor 26 is designed such that transistor 26 is capable of sinking a greater vale of current than transistor 24 can source (I3). For example, in one embodiment, the read voltage across device 12 may be approximately 0.4 volts. The gate of the transistor 26 is tied to the read bias voltage $V_b$ which is set to a value equal to the read voltage plus the transistor 26 threshold voltage plus the voltage necessary to allow the transistor 26 to pass a current slightly greater than $I_3$ from transistor 24. Voltage Vb may therefore be represented as Vread+Vt+Von or approximately 1.2 volts. The read bias voltage must be set high enough to allow the cell 12 state to be read, but is low enough to prevent disturbing of the stored cell 12 state. The read scheme may be a DC method of providing a constant indication of the cell 12 state in the form of the current passing through the cell 12 as well as at the output node, Vo. Alternatively Vb may be a pulsed voltage which is only applied at a time when it is desired to read the state of the latch (the state of OUM device 12 and the corresponding value of Vo)

The current I3 ranges from relatively low if the cell 12 is in a higher resistance state and relatively high if the cell is in a lower resistance state. This current can then be used to digitally control external circuitry depending on the cell 12 state.

When the device 12 is set in the lower resistance state, the transistor 24 saturates, dropping the transistor 24 and 26 drain voltages. This drain voltage drop is designed to turn off the NMOS transistor 30 or to have it weakly on. Simultaneously, the PMOS transistor 28 is turned on or turned on harder. An output voltage $V_o$ is produced at the node $V_0$ near or equal to the supply voltage $V_{DD}$. When the device 12 is in the reset or higher resistance state, only a fraction of the current I3 flows from the transistor 24 and the transistor 26 source is held higher. As a result, this drain voltage increase is designed to turn off the PMOS transistor 28 or to have it weakly on. Simultaneously, the NMOS transistor 30 is turned on or turned on harder. The inverted output voltage $V_0$ is held at or near ground.

The transition region of the transfer characteristic of the inverter formed by transistors 28 and 30 may be centered between the higher and lower voltage limits of the signal swing at the drain of the transistor 26.

The transistors 20 and 22 may be used to write the memory state of the device 12 to either the set or reset states in one embodiment. The circuit of FIG. 2 may also be operated by leaving Vb at ground until it is desired to read out the state of the latch (and therefore the state of the OUM memory device 12). This will cause the output voltage V0 to move to the ground level. When readout is desired the voltage at Vb is raised to the vicinity of 1.2V causing output voltage V0 to assume a state determined by the state of device 12 as previously described. Following the readout of the latch state the voltage Vb may be returned to ground again.

DOUBLE OUM CELL EMBODIMENT

Figure 3:
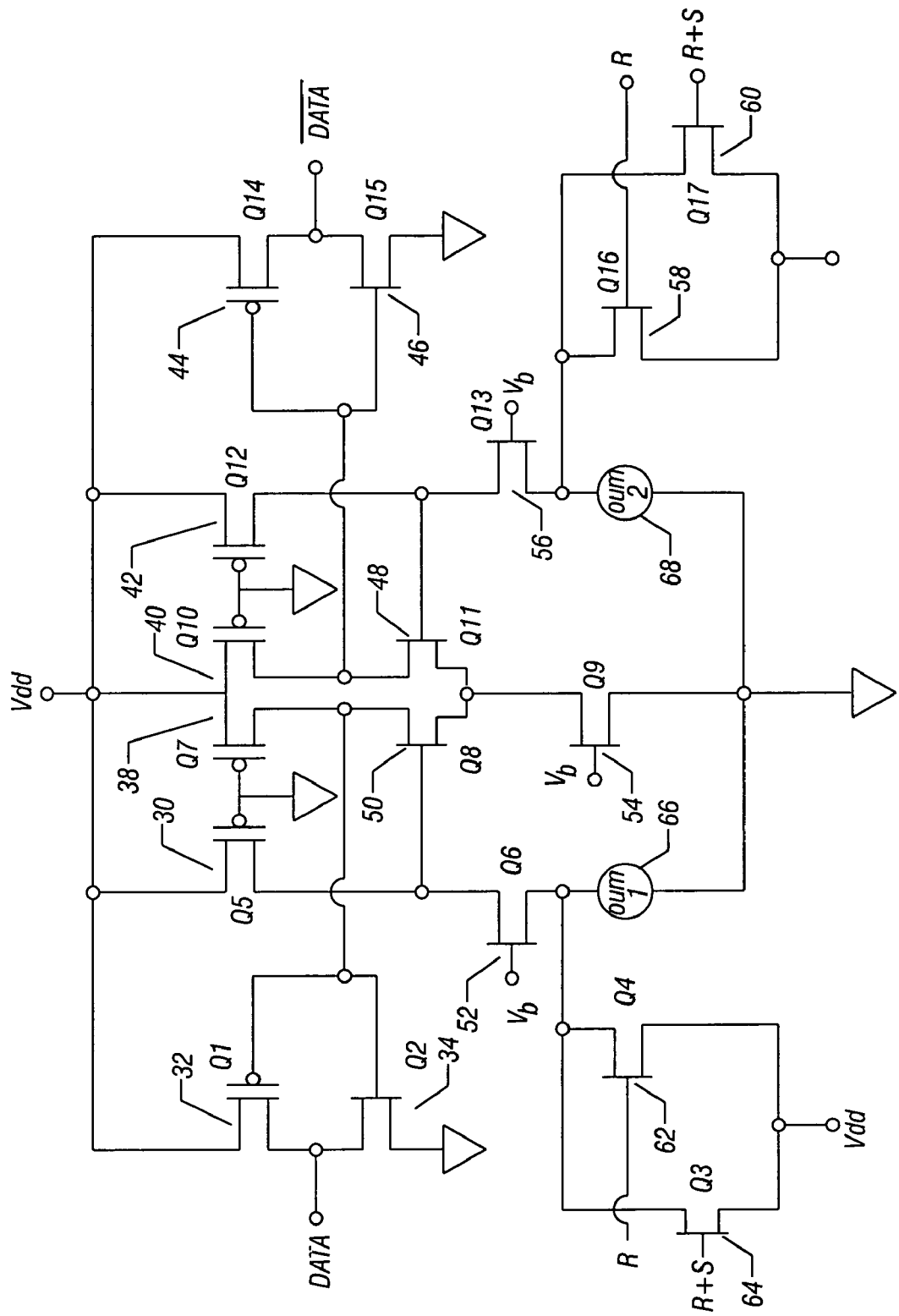
FIG. 3 is a schematic drawing of another embodiment of the present invention.

In accordance with another embodiment of the present invention, shown in FIG. 3, the circuit provides a non-volatile latch function with wider margin for component variations, temperature variations, drift, and the like. The embodiment shown in FIG. 3 uses two phase change memory devices 66 and 68 that are driven to complementary states. In other words, one of the phase change memory devices 66 or 68 is set and the other is reset at all times.

Transistors 62, 64, 32, 34, 52, 30 and OUM device 66 form a latch similar to the type described above in FIG. 2. In similar manner, transistors 42, 44, 46, 58, 60 and OUM device 68 form another latch of the type described above in FIG. 2.

One difference is that in both these latches the output driver is driven by a different voltage node, and that node in each case is the drain of a transistor in an additional stage, the differential stage formed by transistors 38, 40, 48, 50 and 54.

In the write operation, the transistors 62 and 64 are used to provide set and reset current to the phase change memory 66 and the transistors 58 and 60 are used to provide set and reset current to the phase change memory 68. The transistors 64 and 60 may be sized to provide the set level of current, and the transistors 62 and 58 may be sized to provide the difference between set and reset levels of current. For example, to reset the phase change memory 66, the gates of both NMOS transistors 64 and 62 are driven to the supply voltage $V_{DD}$. To set the phase change memory 66, the gate of transistor 64 is driven to the supply voltage $V_{DD}$. Alternatively, each of transistors 64 and 62 can be sized to provide the set and reset current, respectively.

The read bias voltage $V_b$, applied to the gates of transistors 52, 54, and 56, is chosen to provide a DC read voltage across the phase change memory devices 66 and 68. For example, the read voltage may be 0.4 volts in one embodiment. The read bias voltage is, therefore, the read voltage plus the threshold voltage, plus a a Von voltage to supply the read current. A preferred read voltage is about 1.2 volt in one embodiment.

The phase change memories 66 and 68 are in complementary states. PMOS transistors 38 and 40 have their gates grounded allowing them each to pass current to their respective identical differential connected transistors, either NMOS transistor 50 and 48, respectively. The differential pair 50 and 48 are driven by the difference in voltage between the drains of transistors 52 and 56. The drain voltage of transistor 52 and 56 are each determined by the state of their respective OUM memory device 66 or 68. Transistor 54 is designed to be able to sink more current than can be supplied by either of the identical transistors 38 and 40.

Whichever phase change memory is in the set or lower resistance state will cause the drain of either transistor 52 or 56 to fall to approximately 0.5 volts, in the example given above, while the other transistor 52 or 56 will pass little current and its drain will be closer to the supply voltage $V_{DD}$. This differential voltage (from the drain of transistor 52 to the drain of transistor 56) will cause the differential amplifier formed by the transistors 38, 54, and 40 and the differential pair 50 and 48 to attain the stable state.

The phase change memory device in the reset state forces the drain of transistor 50 or 48 to go to a lower voltage of approximately 0.5 volts and the opposing transistor drain is forced closer to the supply voltage $V_{DD}$. The inverters formed by transistors 32 and 34, 44 and 46 then provide ground to $V_{DD}$ complementary metal oxide semiconductor output levels DATA and its complement DATA bar to the logic network. In another embodiment, transistor 54 could also be a PMOS transistor whose gate is grounded.

The circuit of FIG. 3 may also be used in a mode where the voltage Vb is at ground until reading of the state of the storage devices 66 and 68 is desired at which time Vb is raised to a voltage in the vicinity of 1.2V and the DATA and DATA bar outputs assume the proper states as described above. Following the reading of the output state the voltage Vb may be returned to the ground state.

Figure 4:
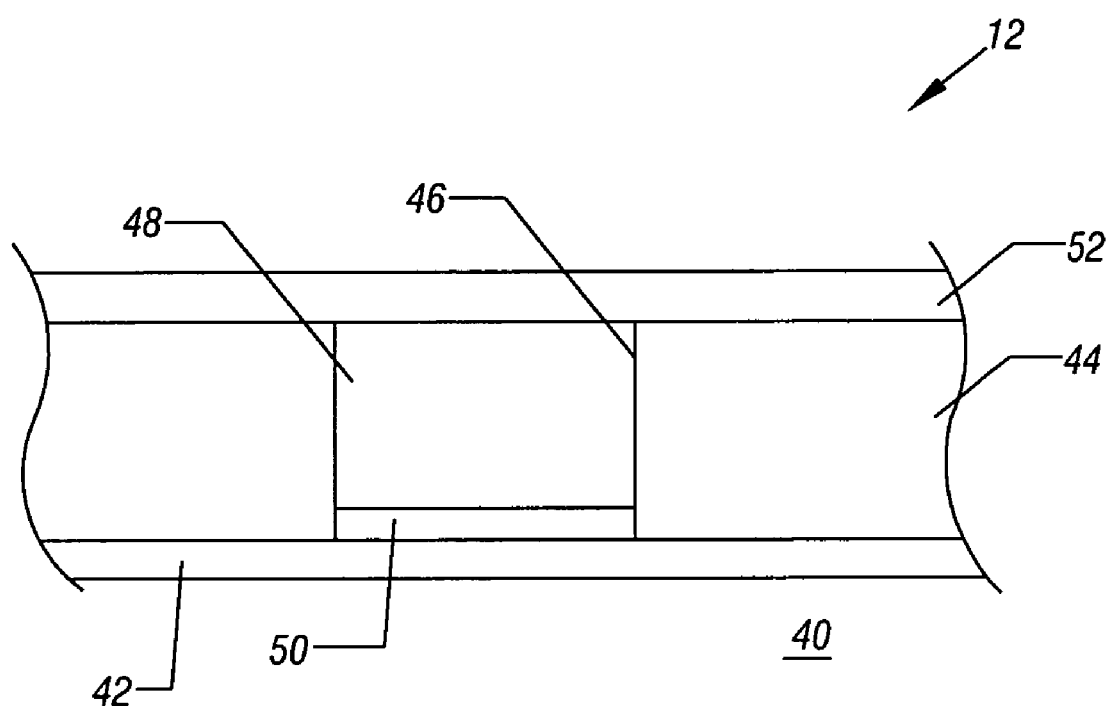
FIG. 4 is an enlarged, cross-section of a phase change memory cell.

Referring to FIG. 4, the cell 12 may be formed in an integrated circuit over a substrate 40. In some embodiments, logic elements may be formed in the substrate 40. The phase change memory element or cell 12 may be formed in a pore 46 defined within an insulator 44. An upper electrode 52 may sandwich a chalcogenide material 48 between itself and a heater 50. The upper electrode 52 may be coupled to the input current, be it $I_1$ and/or $I_2$, and the heater 50 may be coupled to the ground node.

Referring to FIG. 4, a first conductive line 42 may be formed in a structure 40. The structure 40 may be an interlayer dielectric over a semiconductor substrate. The line 42 may, for example, be a ground line. The line 42 may be formed of any of a variety of conductors including copper. An insulating layer 44, such as an oxide layer, may then be formed over the substrate 40.

As shown in FIG. 4, a pore 46 may be formed in the insulating layer 44 using any of a variety of techniques. Thereafter, the pore 46 may be filled with a heater 50 in accordance with one embodiment of the present invention. The heater 50 may be any of a variety of resistive, conductive materials, including titanium nitride. Then, a chalcogenide layer 48 may be formed over the insulating layer 44.

The chalcogenide layer 48 may be a phase change, programmable material capable of being programmed into one of at least two memory states by applying a current to alter the phase of memory material between a more crystalline state and a more amorphous state, wherein the resistance of memory material in the substantially amorphous state is greater than the resistance of memory material in the substantially crystalline state.

Programming of the layer 48 to alter the state or phase of the material may be accomplished by applying voltage potentials to electrodes or lines 42 and 52, thereby generating a voltage potential across the layers 48 and 50. An electrical current may flow through the layer 48 in response to the applied voltage potentials, and may result in heating of the layer 48. For example, in one embodiment, a pulse on the order of 10 to 40 nanoseconds may be used to program the material to the reset state.

This heating may alter the state or phase of chalcogenide. Altering the phase or state of layer 48 may alter the electrical characteristic of memory material, e.g., the resistance of the material may be altered by altering the phase of the memory material.

In the "reset" state, the memory material may be in an amorphous or semi-amorphous state and in the "set" state, the memory material may be in a crystalline or semi-crystalline state. The resistance of memory material in the amorphous or semi-amorphous state may be greater than the resistance of memory material in the crystalline or semi-crystalline state. It is to be appreciated that the association of "reset" and "set" with amorphous and crystalline states, respectively, is a convention and that at least an opposite convention may be adopted.

Using electrical current, the memory material may be heated to a relatively higher temperature to amorphosize the memory material and "reset" the memory material (e.g., program memory material to a logic "0" value). Heating the volume of memory material to a relatively lower crystallization temperature may crystallize memory material and "set" memory material (e.g., program memory material to a logic "1" value). Various resistances of memory material may be achieved to store information by varying the amount of current flow and duration through the volume of memory material.

In accordance with some embodiments of the present invention, the latch 10 may be used to configure a reconfigurable integrated circuit such as a logic device. Thus, one or more latch 10 devices may be included within the integrated circuit to enable the circuit to be configured for special situations after manufacturing. Of course, the present invention is in no way limited to such embodiments.

Figure 5:
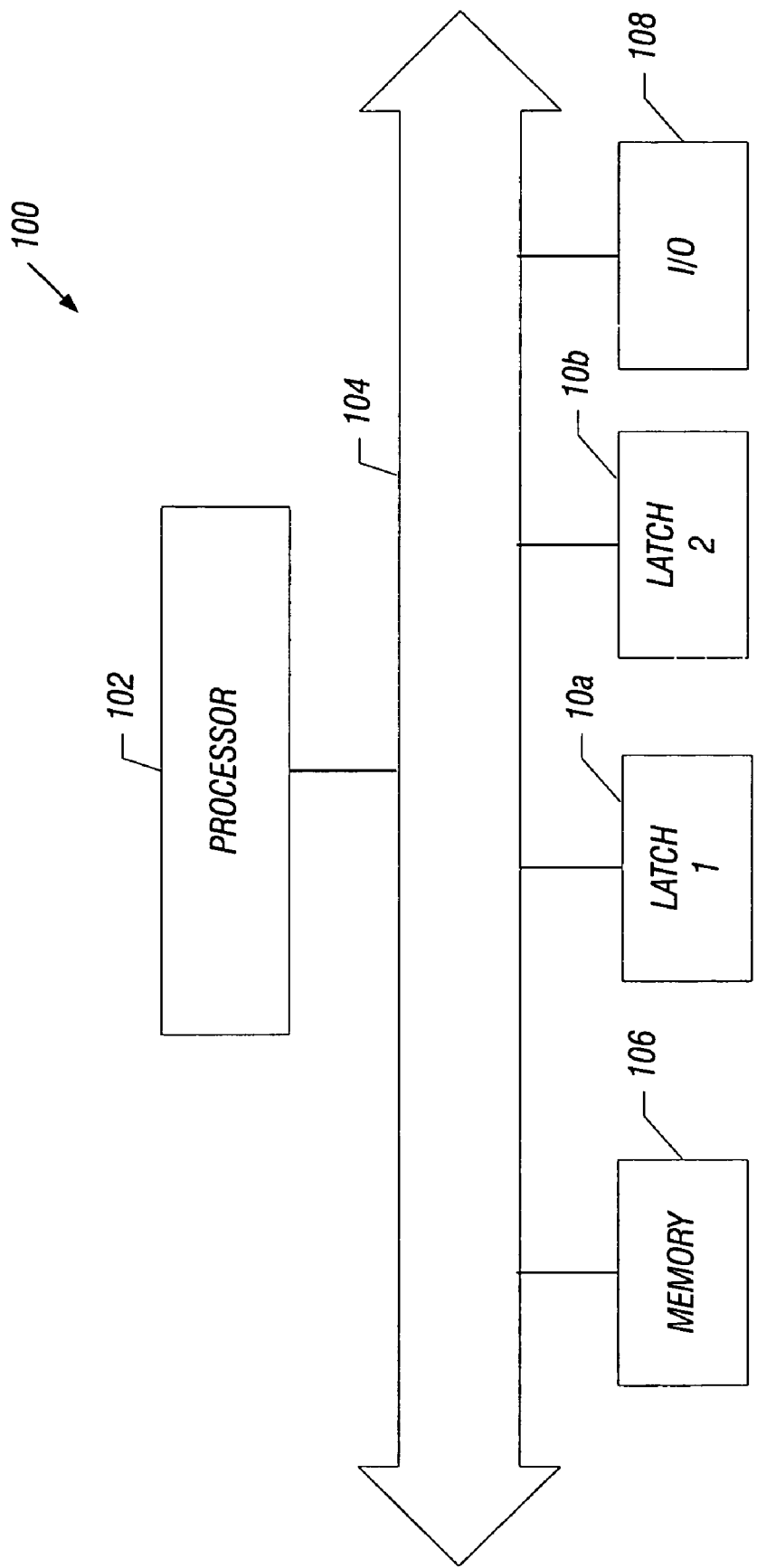
FIG. 5 is a schematic depiction of an integrated circuit including the latch.

Referring to FIG. 5, an integrated circuit 100, including a pair of latches 10*a* and 10*b,* configured as described herein, enable the integrated circuit 100 to be configured after manufacturing. As one example, the integrated circuit 100 may be a system on a chip including a processor 102, a bus 104, a memory 106, and an input/output interface 108, in addition to the latches 10*a* and 10*b*.

After manufacturing, each of the latches may be set or reset in order to store a given configuration setting. For example, the system on a chip 100 may be configured to one of a variety of configurations for which the system on a chip is adapted. This allows, as one example, the system on a chip to be sold for different applications, possibly at different prices. Other applications of such latches and the configuration that they enable may be provided as well. For example, the latch may be employed in a digital electronic system to enable storage of a system memory state to survive the loss of system power and to facilitate the re-powering of the system.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   latching a binary state in a phase change memory element having a chalcogenide layer;
   using a pair of transistors to program said element;
   programming the memory element by supplying current from both transistors to program said memory element to a reset state; and
   providing current from only one transistor to program the memory element to a set state.

2. The method of claim 1 including providing a read bias voltage to read the state of the memory element.

3. The method of claim 2 including providing a read circuit including a transistor whose gate is coupled to the read bias voltage.

4. The method of claim 3 including providing an output circuit to output a level indicative of the state of the memory element.

5. The method of claim 2 including using a read bias voltage that is high enough to allow reading of the element state, but low enough to avoid degradation of the storage state on the memory element.

6. The method of claim 5 where the read bias voltage is applied only at a time when readout of the stored device state is desired.

7. The method of claim 1 including providing a first transistor to receive a set and a reset signal and a second transistor to receive a reset signal.

8. The method of claim 7 including using said first and second transistor to program said memory element to either the set or reset state.

9. The method of claim 1 including latching a binary state and its complement in two phase change memory elements, each having a chalcogenide layer.

10. A latch comprising:
    a phase change memory element;
    a programming circuit coupled to said element, said programming circuit including a pair of transistors, one to receive a reset and a set latch command and the other to receive only the set latch command; and
    a reading circuit coupled to said element.

11. The latch of claim 10 including an output circuit including an inverter coupled to said reading circuit.

12. The latch of claim 10 wherein said reading circuit includes a pair of transistors, both being operable to read a state of memory element.

13. The latch of claim 10 wherein said reading circuit includes a current source to produce a first current for reading said element, said first current being less than a read current that would disturb said element.

14. The latch of claim 10 wherein said reading circuit to produce a lower current when said latch is reset and a higher current when said latch is set.

15. The latch of claim 10 including a pair of phase change memory elements.

16. The latch of claim 15 wherein said elements arc maintained in complementary states.

17. The latch of claim 10 wherein said reading circuit includes a differential amplifier.

* * * * *

UNITED STATES PATENT AND TRADEMARK OFFICE
CERTIFICATE OF CORRECTION

PATENT NO. : 7,471,554 B2  Page 1 of 1
APPLICATION NO. : 11/341983
DATED : December 30, 2008
INVENTOR(S) : Edward J. Spall and Tyler Lowrey It is certified that error appears in the above-identified patent and that said Letters Patent is hereby corrected as shown below:

Column 7:
Line 3, "arc" should be --are--.

Signed and Sealed this

Twenty-fourth Day of March, 2009

JOHN DOLL
*Acting Director of the United States Patent and Trademark Office*